US011688641B2

(12) United States Patent
Saeki et al.

(10) Patent No.: US 11,688,641 B2
(45) Date of Patent: Jun. 27, 2023

(54) ELEMENT CHIP ISOLATION METHOD USING LASER GROOVING AND PLASMA ETCHING

(71) Applicant: Panasonic Intellectual Property Management Co., Ltd., Osaka (JP)

(72) Inventors: Hidefumi Saeki, Osaka (JP); Hidehiko Karasaki, Hyogo (JP); Shogo Okita, Hyogo (JP); Atsushi Harikai, Osaka (JP); Akihiro Itou, Kyoto (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 374 days.

(21) Appl. No.: 16/881,165

(22) Filed: May 22, 2020

(65) Prior Publication Data
US 2020/0381304 A1    Dec. 3, 2020

(30) Foreign Application Priority Data
May 30, 2019    (JP) .............................. JP2019-101491

(51) Int. Cl.
*H01L 21/82*    (2006.01)
*H01L 21/56*    (2006.01)
(Continued)

(52) U.S. Cl.
CPC .......... *H01L 21/82* (2013.01); *H01L 21/3065* (2013.01); *H01L 21/31122* (2013.01); *H01L 21/31127* (2013.01); *H01L 21/568* (2013.01)

(58) Field of Classification Search
CPC ................. H01L 21/82; H01L 21/3065; H01L 21/31122; H01L 21/31127; H01L 21/568;
(Continued)

(56) References Cited

U.S. PATENT DOCUMENTS

2010/0173474 A1* 7/2010 Arita .................. H01L 21/6836
257/E21.599
2018/0158713 A1* 6/2018 Okita ................ H01J 37/32715
(Continued)

FOREIGN PATENT DOCUMENTS

JP    2009-130241 A    6/2009
JP    2017-114945 A    6/2017

OTHER PUBLICATIONS

Japanese Office Action issued in Japanese Patent Application No. 2019-101491 dated Feb. 7, 2023.

*Primary Examiner* — Herve-Louis Y Assouman
(74) *Attorney, Agent, or Firm* — Pearne & Gordon LLP

(57) ABSTRACT

An element chip manufacturing method including: attaching a substrate via a die attach film (DAF) to a holding sheet; forming a protective film that covers the substrate; forming an opening in the protective film with a laser beam, to expose the substrate in the dicing region therefrom; exposing the substrate to a first plasma to etch the substrate exposed from the opening, so that a plurality of element chips are formed from the substrate and so that the DAF is exposed from the opening; exposing the substrate to a second plasma to etch the die attach film exposed from the opening, so that the DAF is split so as to correspond to the element chips; and detaching the element chips from the holding sheet, together with the split DAF. The DAF is larger than the substrate. The method includes irradiating the laser beam to the DAF protruding from the substrate.

6 Claims, 17 Drawing Sheets

(51) Int. Cl.
*H01L 21/3065* (2006.01)
*H01L 21/311* (2006.01)
*H01L 21/78* (2006.01)

(58) Field of Classification Search
CPC ......... H01L 21/30655; H01L 21/31138; H01L 21/67109; H01L 21/6831; H01L 21/68742; H01L 21/78; H01L 2221/68327; H01L 2221/68381; H01L 21/6836; H01J 37/32623; H01J 37/32651
See application file for complete search history.

(56) References Cited

U.S. PATENT DOCUMENTS

| | | | |
|---|---|---|---|
| 2018/0308755 A1* | 10/2018 | Tabuchi | H01L 21/6836 |
| 2018/0342424 A1* | 11/2018 | Okita | H01L 21/31138 |
| 2019/0206734 A1* | 7/2019 | Sekiya | H01L 21/78 |
| 2019/0221479 A1* | 7/2019 | Okita | H01L 21/78 |

* cited by examiner

ELEMENT CHIP ISOLATION METHOD USING LASER GROOVING AND PLASMA ETCHING

CROSS REFERENCE TO RELATED APPLICATION

The present application is based on and claims priority under 35 U.S.C. § 119 with respect to the Japanese Patent Application No. 2019-101491 filed on May 30, 2019, of which entire content is incorporated herein by reference into the present application.

TECHNICAL FIELD

The present invention relates to an element chip manufacturing method, specifically to a method of applying plasma etching to a substrate mounted on a die attach film, to singulate the substrate.

BACKGROUND

In producing from one substrate a plurality of element chips to be multilayered, such as flash memories, some method singulate a substrate mounted on a die attach film (also known as die bonding film), as in Patent Document 1 (JP 2017-114945). Die attach film has an adhesive property and serves as a dicing tape as well as a bonding material. This can improve the ease of handling and pickup, and produce a plurality of element chips each provided with a bonding material.

Typically, in the singulation of a substrate mounted on a die attach film (DAF), the substrate is diced (or half-cut) first, and then, the DAF is split by a cool expansion system.

SUMMARY

In the cool expansion system, a dicing tape is expanded to widen the gap between element chips. This splits the DAF adhering to the substrate.

The DAF is usually designed to be larger in area than the substrate in view of ease of positioning and versatility. Therefore, a peripheral portion of the DAF usually protrudes from the substrate. When the dicing tape is expanded in this state, the DAF fails to follow the dicing tape, and peels off and floats away from the dicing tape at the peripheral portion. The element chips are picked up by a bonding device provided with a camera. While imaging the element chip by the camera and identifying its position, the pickup is carried out. The floating portion of the dicing tape, if any, is erroneously recognized as the element chip, tending to cause pickup error.

One aspect of the present invention relates to an element chip manufacturing method including: a preparation step of preparing a substrate including a plurality of element regions and a dicing region defining the element regions, the substrate having a first surface and a second surface opposite the first surface; an attaching step of attaching the substrate via a die attach film to a holding sheet secured on a frame, with the die attach film facing the second surface; a protective film formation step of forming a protective film that covers the first surface of the substrate attached to the holding sheet; a laser grooving step of irradiating a laser beam to the protective film along the dicing region, to form an opening in the protective film, so that the substrate in the dicing region is exposed from the opening; a first etching step of exposing the substrate to a first plasma to etch the substrate exposed from the opening, so that a plurality of element chips are formed from the substrate and so that the die attach film is exposed from the opening; a second etching step of exposing the substrate to a second plasma to etch the die attach film exposed from the opening, so that the die attach film is split so as to correspond to the element chips; and a pickup step of detaching the element chips from the holding sheet, together with the split die attach film; wherein the die attach film used in the attaching step is larger than the substrate, and the laser grooving step includes a first irradiation step of irradiating the laser beam to the die attach film protruding from the substrate.

According to the present invention, element chips can be produced with high productivity.

DETAILED DESCRIPTION

The present embodiment includes a laser grooving step in which a laser beam is irradiated to the DAF protruding from the substrate as well as to the protective film. This makes a cut in the DAF. When the dicing tape is expanded in the process of pickup, the DAF is split from this cut and thus unlikely to float away from the dicing tape.

A manufacturing method according to the present embodiment will be described below with reference to the drawings as appropriate.

Figure 1:
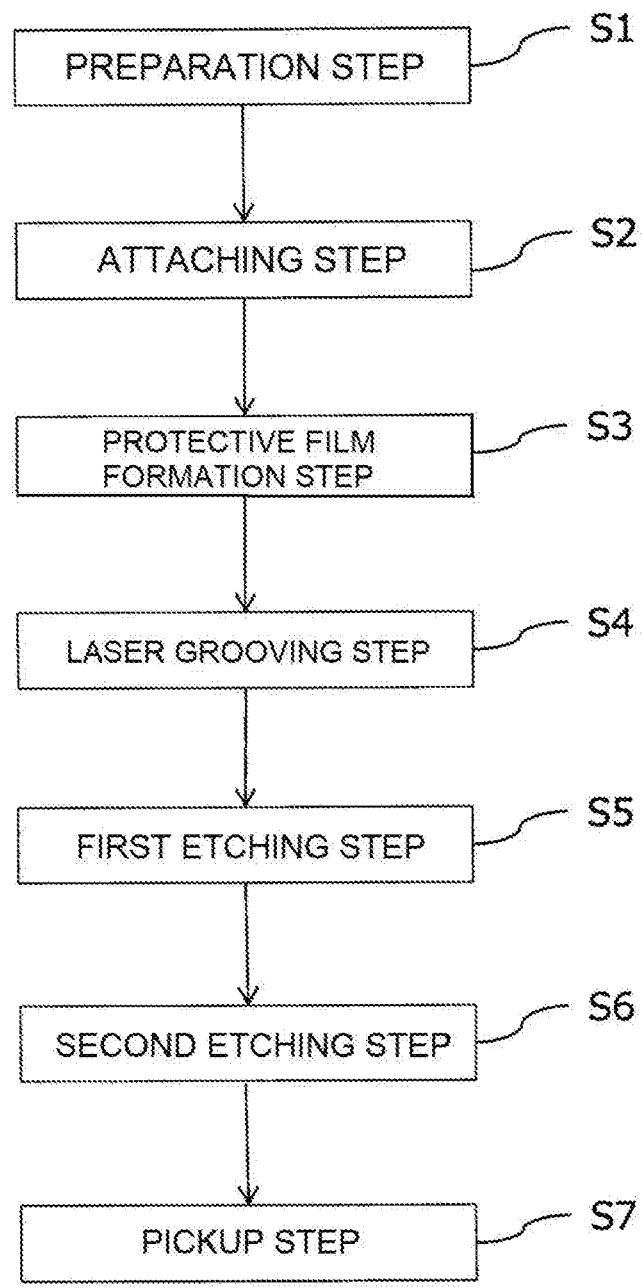
FIG. 1 is a flowchart of a manufacturing method according to an embodiment of the present invention.

FIG. 1 is a flowchart of the manufacturing method according to the present embodiment.

The element chip manufacturing method according to the present embodiment includes: a preparation step (S1) of preparing a substrate including a plurality of element regions and a dicing region defining the element regions, the substrate having a first surface and a second surface opposite the first surface; an attaching step (S2) of attaching the substrate via a die attach film to a holding sheet secured on a frame, with the die attach film facing the second surface; a protective film formation step (S3) of forming a protective film that covers the first surface of the substrate attached to the holding sheet; a laser grooving step (S4) of irradiating a laser beam to the protective film along the dicing region, to form an opening in the protective film, so that the substrate in the dicing region is exposed from the opening; a first etching step (S5) of exposing the substrate to a first plasma to etch the substrate exposed from the opening, so that a plurality of element chips are formed from the substrate and so that the die attach film is exposed from the opening; a second etching step (S6) of exposing the substrate to a second plasma to etch the die attach film exposed from the opening, so that the die attach film is split so as to correspond to the element chips; and a pickup step (S7) of detaching the element chips from the holding sheet, together with the split die attach film. The die attach film used in the attaching step is larger than the substrate, and the laser grooving step includes a first irradiation step of irradiating the laser beam to the die attach film protruding from the substrate.

(1) Preparation Step

A substrate subjected to dicing is prepared first.

(Substrate)

The substrate has a first surface and a second surface and includes a plurality of element regions and a dicing region defining the element regions. The substrate includes, for example, a wiring layer disposed on the first surface side and a semiconductor layer disposed on the second surface side. Etching the substrate along the dicing region provides element chips.

The substrate may be of any size, and the maximum diameter thereof is, for example, 50 mm or more and 300 mm or less. The substrate may be of any shape, and is, for example, circular or rectangular. The substrate may be provided with a cut, such as an orientation flat or a notch.

The semiconductor layer contains, for example, silicon (Si), gallium arsenide (GaAs), gallium nitride (GaN), or silicon carbide (SiC). The semiconductor layer in the element chip may have any thickness; the thickness is, for example, 20 µm or more and 1000 or less, and may be 100 µm or more and 300 µm or less.

The wiring layer constitutes, for example, a semiconductor circuit, an electronic component element, or MEMS, and may include an electrically insulating film, a metal material, a resin layer (e.g., polyimide), a resist layer, an electrode pad, a bump, and others. The insulating film may be in the form of a laminate with a wiring metal material (e.g., multilevel wiring layer, redistribution layer). The multilevel wiring layer and the redistribution layer each may be of any thickness; the thickness is, for example, 1 µm or more and 10 µm or less.

The shape of the dicing region may be set as appropriate according to the shape of desired element chips, without limited to a straight linear shape, and may be, for example, a zigzag shape or a wavy line shape. The element chip is, for example, rectangular or hexagonal in shape.

The width of the dicing region may be set as appropriate according to the sizes of the substrate and the element chips, and others. The width of the dicing region is, for example, 10 µm or more and 300 µm or less. A plurality of the dicing regions may have the same width or different widths. The dicing region is typically formed in plural numbers on the substrate. The pitch between the dicing regions adjacent to each other also may be set as appropriate according to the sizes of the substrate and the element chips, and others.

Figure 2:
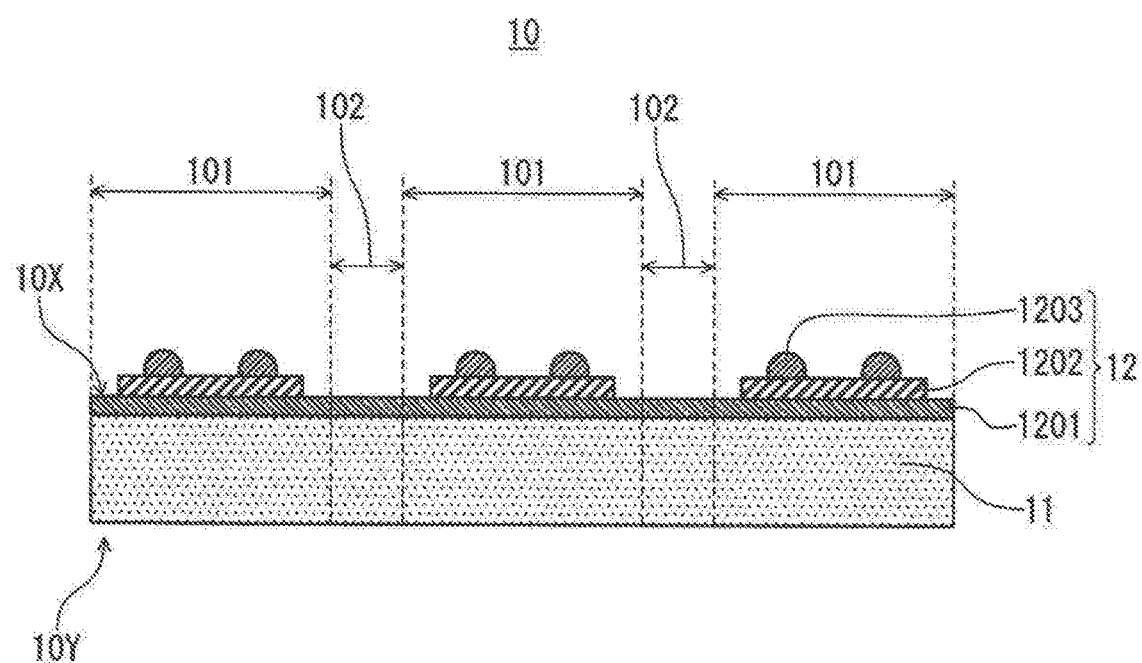
FIG. 2 is a schematic cross-sectional view of a substrate according to an embodiment of the present invention.

FIG. 2 is a schematic cross-sectional view of the substrate.

A substrate 10 has a first surface 10X and a second surface 10Y and includes a plurality of element regions 101 and a dicing region 102 defining the element regions 101. The substrate 10 includes a semiconductor layer 11 and a wiring layer 12 disposed on the first surface 10X side of the semiconductor layer 11. The wiring layer 12 includes, for example, in the element region 101, a multilevel wiring layer 1201, an electrically insulating film 1202, and bumps 1203, and in the dicing region 102, the multilevel wiring layer 1201.

(2) Attaching Step

The substrate is attached at the second surface to a holding sheet secured on a frame, via a die attach film (DAF).

(Frame)

The frame is a frame member having an opening equal to or greater in area than the whole substrate, and has a predetermined width and a substantially consistent thin thickness. The frame has such a rigidity that it can be conveyed with the holding sheet and the substrate held thereon. The opening of the frame may be of any shape, for example, circular, rectangular, or polygonal, such as hexagonal. The frame is provided with a notch or a corner cut for correct positioning. The frame may be made of any material, for example, a metal, such as aluminum or stainless steel, or a resin.

Hereinafter, the frame and the holding sheet secured on the frame are collectively referred to as a conveying carrier.

(Holding Sheet)

The holding sheet may be made of any material. For easy attachment of the substrate thereto, the holding sheet preferably includes an adhesive layer and a non-adhesive layer with flexibility.

The non-adhesive layer may be made of any material, for example, polyolefin such as polyethylene and polypropylene, polyvinyl chloride, polyester such as polyethylene terephthalate, and other thermoplastic resins. The resin film may include a rubber component for adding elasticity (e.g., ethylene-propylene rubber (EPM), ethylene-propylene-diene rubber (EPDM)), and various additives, such as a plasticizer, a softener, an antioxidant, and an electrically conductive material. The thermoplastic resin may have a functional group that exerts photopolymerization reaction, such as an acryl group. The non-adhesive layer may have any thickness; the thickness is, for example, 50 µm or more and 300 µm or less, preferably 50 µm or more and 150 µm or less.

The holding sheet is attached at its periphery to the frame, with the side where the adhesive layer is disposed (adhesive side) in contact with the frame, to cover the opening of the frame. On the adhesive side exposed from the opening of the frame, the substrate is attached via a die attach film (DAF), with one of the principal surfaces (second surface) of the substrate facing the adhesive side. The substrate is thus held on the holding sheet.

The adhesive layer is preferably made of an adhesive component, the adhesive strength of which is reduced by ultraviolet (UV) irradiation. In this case, by performing UV irradiation in a pickup step, the element chips can be easily peeled off from the adhesive layer, which eases the pickup. The adhesive layer can be obtained by, for example, applying a UV curing acrylic adhesive on one side of the non-adhesive layer, in a thickness of 5 μm or more and 100 μm or less (preferably 5 μm or more and 15 μm or less).
(Die Attach Film (DAF))

The DAF is formed of, for example, a resin composition containing a resin and an inorganic filler.

Examples of the resin include photosensitive phenol resin, such as a phenol/formaldehyde novolac resin, a cresol/formaldehyde novolac resin, a xyrenol/formaldehyde novolac resin, a resorcinol/formaldehyde novolac resin, a phenol-naphthol/formaldehyde novolac resin.

Examples of the inorganic filler include aluminum hydroxide, magnesium hydroxide, calcium carbonate, magnesium carbonate, calcium silicate, magnesium silicate, calcium oxide, magnesium oxide, aluminum oxide, aluminum nitride, and silica.

The DAF may have any thickness. In view of ease of handling, the thickness of the DAF may be 10 μm or more and 100 μm or less, and may be 20 μm or more and 50 μm or less.

The DAF is larger than the substrate and is smaller, for example, than the opening of the frame. Accordingly, when seen from the direction normal to the first principal of the substrate, the DAF protrudes from the substrate, for example, so as to surround the outer edge of the substrate. Hereinafter, a region protruding from the substrate of the DAF is referred to as a protruding region.

Figure 3:
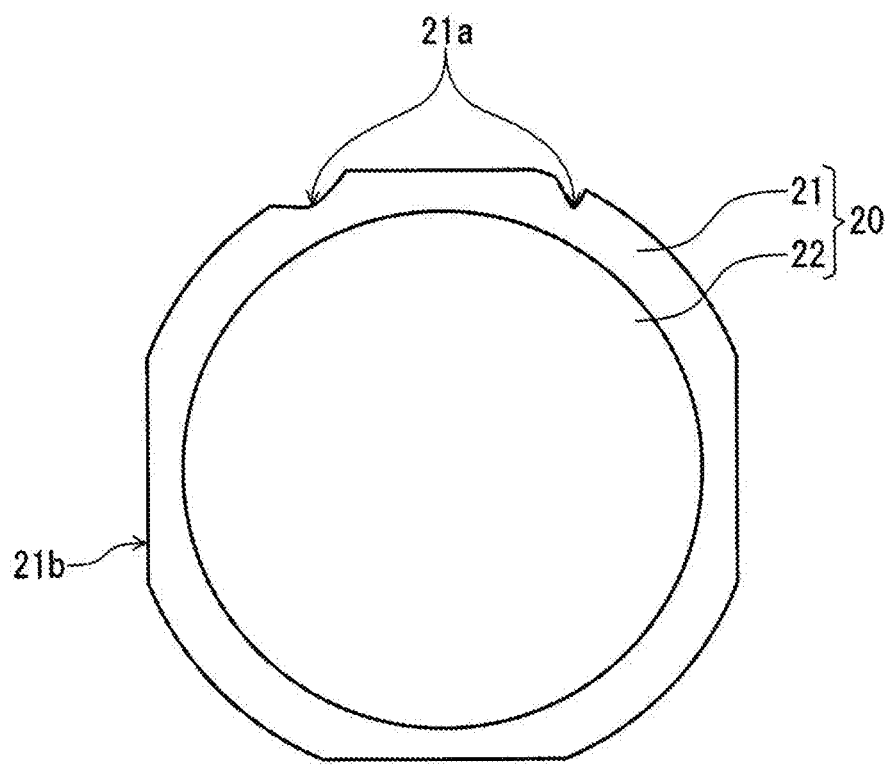
FIG. 3 is a schematic top view of a holding sheet and a frame.
Figure 4:
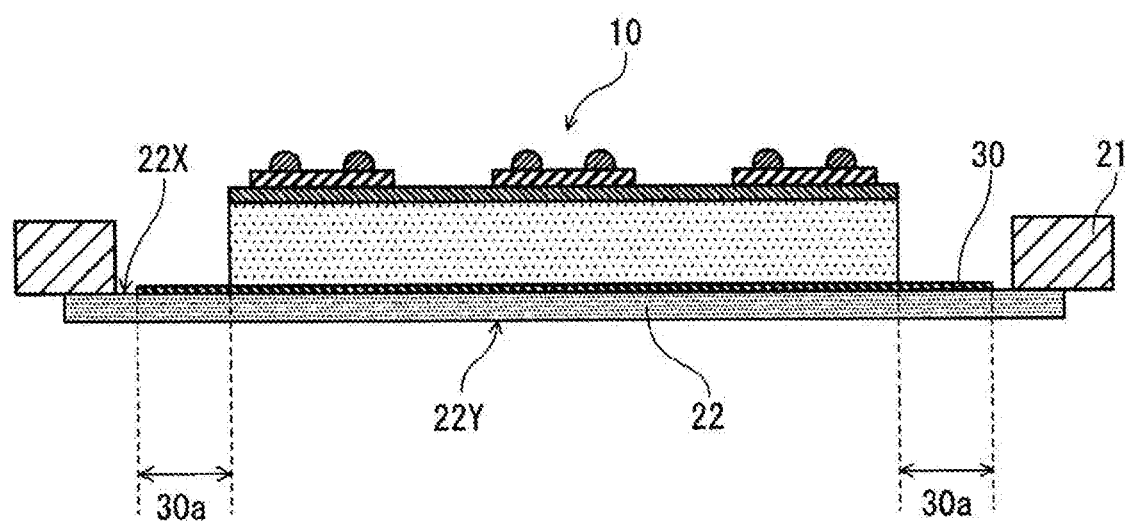
FIG. 4 is a schematic cross-sectional view of the substrate after an attaching step according to the embodiment of the present invention.

FIG. 3 is a schematic top view of the conveying carrier. FIG. 4 is a schematic cross-sectional view of the substrate after the attaching step.

A conveying carrier 20 includes a frame 21 and a holding sheet 22 secured to the frame 21. The frame 21 is provided with a notch 21a and a corner cut 21b for correct positioning. An adhesive side 22X of the holding sheet 22 is attached at its periphery to one side of the frame 21, and on the adhesive side 22X exposed from the opening of the frame 21, one of the principal surfaces of the substrate 10 is attached. In plasma processing, the holding sheet 22 is placed on a stage in a plasma processing apparatus, such that a non-adhesive side 22Y opposite the adhesive side 22X comes in contact with the stage.

The substrate 10 is attached to the holding sheet 22 via a DAF 30. The DAF 30 is larger than the substrate 10 and smaller than the opening of the frame 21. Accordingly, the DAF 30 has a protruding region 30a protruding from the substrate 10 so as to surround the outer edge of the substrate 10.
(3) Protective Film Formation Step A protective film that covers the substrate is formed.

The protective film is provided for protecting the element regions of the substrate from plasma exposure and the like.

The protective film contains a resist material, such as a thermosetting resin (e.g., polyimide), a photoresist (e.g., phenol resin), or a water-soluble resist (e.g., acrylic resin).

The protective film can be formed by, for example, forming a resist material into a sheet and attaching the sheet to the first surface, or by applying a liquid raw material of a resist material to the first surface using a spin-coating or spray-coating technique. By changing the amount of the liquid raw material while applying, the thickness of the protective film can be partially changed. Spin-coating and spray-coating may be used in combination, and thereby the coating amount may be adjusted.

The protective film may have any thickness, but is preferably thick enough not to be completely removed by plasma etching in the first and second etching steps. The thickness of the protective film is set, for example, to be greater than a calculated amount (thickness) of the protective film to be etched in the first and second etching steps. The etching amount of the protective film can be determined based on the following: the thickness of the semiconductor layer to be etched in the first etching step; the mask selection ratio (the ratio of the etching rate of the semiconductor layer to that of the protective film) under the plasma etching conditions used in the first etching step; the thickness of the DAF to be etched in the second etching step; and the mask selection ratio (the ratio of the etching rate of the DAF to that of the protective film) under the etching conditions used in the second etching step. For example, given that the semiconductor layer is a silicon having a thickness of 30 μm, the thickness of the DAF is 20 μm, the mask selection ratio in the first etching step is 50 to 200, and the mask selection ratio in the second etching step is 0.5 to 1.0, the protective film can be formed in a thickness of 23 μm or more and 50 μm or less.

The protective film covers at least the first surface of the substrate. The protective film may further cover at least part of the protruding region of the DAF protruding from the substrate. The protective film may further cover the entire protruding region of the DAF and part of the holding sheet.

Figure 5A:
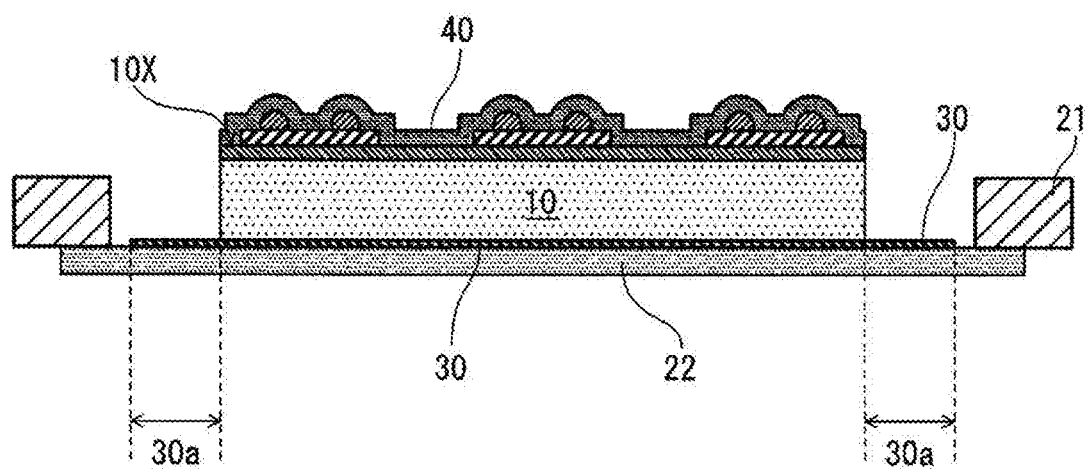
FIG. 5A is a schematic cross-sectional view of the substrate after a protective film formation step according to the embodiment of the present invention.
Figure 5B:
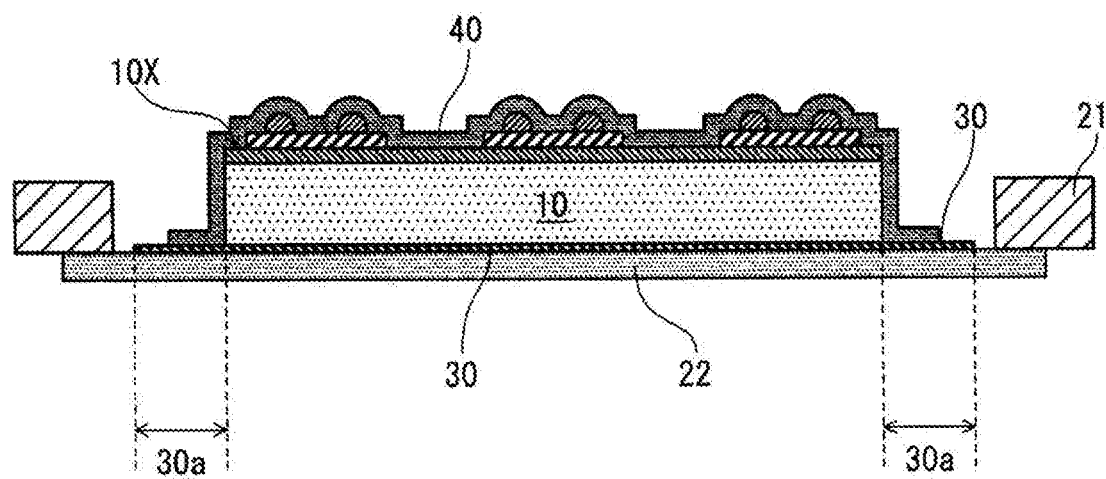
FIG. 5B is a schematic cross-sectional view of another substrate after the protective film formation step according to the embodiment of the present invention.
Figure 5C:
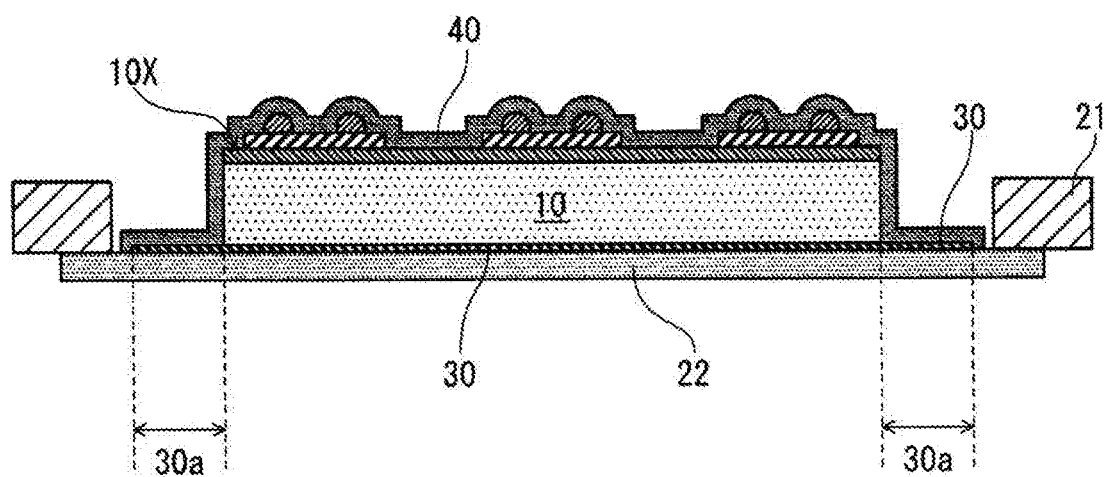
FIG. 5C is a schematic cross-sectional view of yet another substrate after the protective film formation step according to the embodiment of the present invention.

FIG. 5A is a schematic cross-sectional view of the substrate after the protective film formation step according to the present embodiment. FIG. 5B is a schematic cross-sectional view of another substrate after the protective film formation step according to the present embodiment. FIG. 5C is a schematic cross-sectional view of yet another substrate after the protective film formation step according to the present embodiment. A protective film 40 in FIG. 5A covers the first surface 10X of the substrate 10. The protective film 40 in FIG. 5B covers, in addition to the first surface 10X, part of the protruding region 30a of the DAF 30. The protective film 40 in FIG. 5C covers, in addition to the first surface 10X, the entire protruding region 30a of the DAF 30 and part of the holding sheet 22.
(4) Laser Grooving Step This step irradiates a laser beam to the protective film along the dicing region to remove part of the protective film, thereby to form an opening from which the substrate is partially exposed. At this time, it is preferable to remove the protective film and the wiring layer together along the dicing region.

In this step, the laser beam is irradiated also to the protruding region of the DAF. This makes a cut in the protruding region of the DAF. The cut formed in this step may be a cut that divides the DAF throughout its thickness, or may be a half-cut that partially divides the DAF along its thickness.

The laser beam irradiated to the protruding region is preferably irradiated successively also to the substrate in the dicing region. In other words, the laser beam irradiated toward the protruding region is preferably moved across the substrate, until it reaches another point in the protruding region. As a result, the cut made in the protruding region and the opening formed on the substrate are connected on the same line. Therefore, when the pickup step is carried out using a cool expansion system, the DAF can be more easily split because the direction along which the substrate is divided is the same as the direction along which the DAF is split.

Note that, in this process, the holding sheet is preferably intact from damage by the laser beam. In particular, a crack throughout the thickness of the holding sheet, if any, may cause insufficient cooling, abnormal discharge, and other inconveniences in the later plasma etching process. This makes it impossible to achieve a desired etching or causes damage to the plasma processing apparatus. Therefore, in this step, the laser beam is irradiated preferably under the conditions that remove the protective film in the dicing region and at least part of the DAF in the protruding region, but do not remove the holding sheet corresponding to the protruding region.

In view of the above, the point at which the laser irradiation starts (start point) and the point at which the laser irradiation ends (end point) are preferably not on the holding sheet. For example, the laser grooving step preferably includes a first irradiation step of irradiating the laser beam along a first path, the path starting at a point in the protruding region, passing over across the substrate in the dicing region, and ending at another point in the protruding region (e.g., a point-symmetric point with respect to the start point and the center of the DAF). The start and end points of the laser irradiation may be on the edge of the DAF or on about 1 to 5 µm inward from the edge.

The edge of the DAF can be confirmed, for example, by imaging with a camera. The laser processing machine controls, for example, a gate signal for controlling laser pulse output power so as to, for example, stop the laser irradiation at the edge of the DAF.

The damage to the holding sheet can be suppressed, for example, in the following ways.

(First Way)

The first way is to perform the first irradiation step of irradiating a laser beam (first laser beam) successively to the protruding region of the DAF and the substrate, and additionally perform a second irradiation step of irradiating a laser beam (second laser beam) to the substrate only. Thus, the protective film (further, the wiring layer) on the substrate can be reliably removed, while the damage to the holding sheet by laser beam irradiation can be suppressed.

In the first irradiation step, the first laser beam is irradiated along the first path starting at a point in the protruding region, passing over across the substrate in the dicing region, and ending at another point in the protruding region.

In the second irradiation step, the second laser beam is irradiated along a second path, the path starting at a point on the edge of the substrate, passing over the dicing region, and ending at another point on the edge of the substrate (e.g., a point that is point-symmetric to the start point with respect to the center of the substrate). At this time, by carrying out the irradiation such that the first irradiation along the first path and the second irradiation along the second path draw the same locus on the dicing region, the efficiency of the laser beam irradiation can be improved, further improving the productivity.

The first laser beam used in the first irradiation step is irradiated, for example, under the conditions that ablate at least the protective film. Usually, to ablate the DAF including an inorganic filler needs a higher irradiation energy than to ablate the protective film. Therefore, the first laser beam can be irradiated under the conditions that ablate the protective film completely in the thickness direction, while ablating the DAF partially in the thickness direction. Irradiation of the first laser beam along the first path is performed one or more times ($N_1 \geq 1$), and may be performed two or more times ($N_1 \geq 2$). When $N_1 \geq 2$, the irradiations of the first laser beam may be performed under the same conditions or different conditions. The number of times of laser beam irradiation refers to the number of times the laser beam is scanned along a certain path, and does not mean the number of pulses.

The second laser beam used in the second irradiation step is irradiated, for example, under the conditions that ablate the wiring layer. Usually, the DAF is ablated with an irradiation energy lower than the wiring layer is ablated. The second laser beam, however, is not irradiated to the DAF in the protruding region. Therefore, the damage by the second laser beam to the holding sheet beneath the DAF need not to be taken into account. Irradiation of the second laser beam along the second path is performed one or more times ($N_2 \geq 1$), and may be performed two or more times ($N_2 \geq 2$). When $N_2 \geq 2$, the irradiations of the second laser beam may be performed under the same conditions or different conditions.

The first irradiation step and the second irradiation step may be performed in any order. The first irradiation step may be followed by the second irradiation step, or the second irradiation step may be followed by the first irradiation step. The first and second irradiation steps may be repeated alternately, or one of the irradiation steps may be performed between irradiations performed several times of the other irradiation step.

Figure 6A:
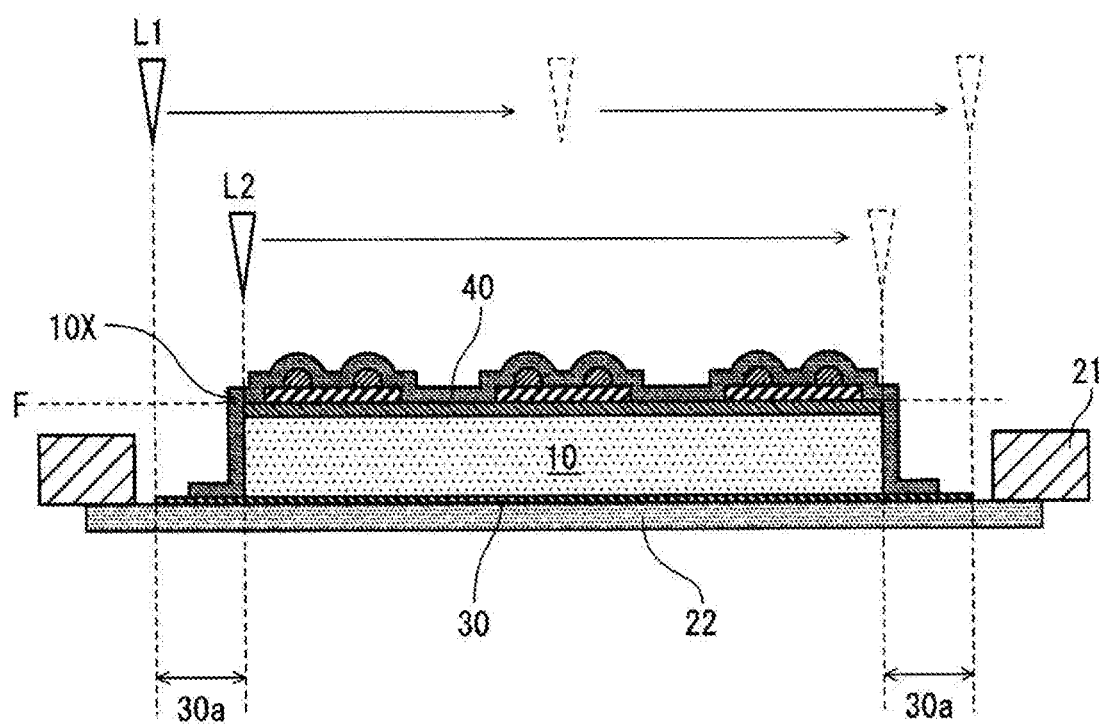
FIGS. 6A and 6B are diagrams for explaining a first way in a laser grooving step according to the embodiment of the present invention, with reference to a schematic cross-sectional view of the substrate and to a schematic top view of the substrate, respectively.
Figure 6B:
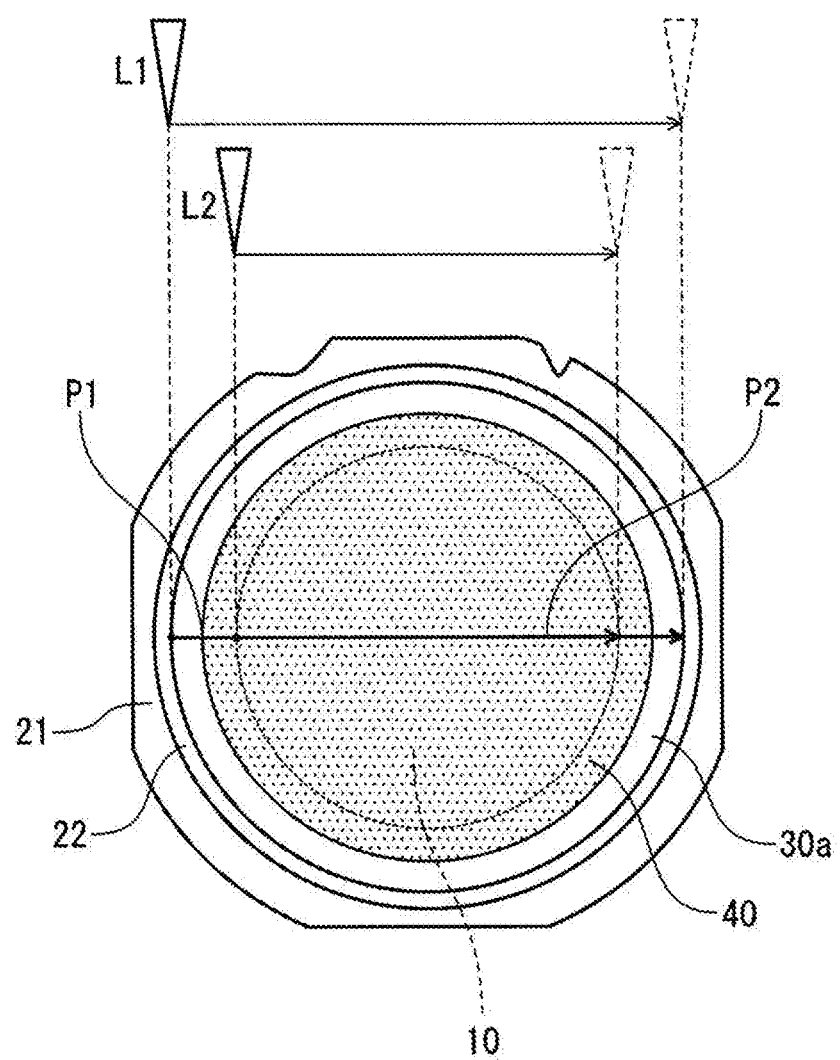

FIGS. 6A and 6B are diagrams for explaining the first way in the laser grooving step according to the present embodiment, with reference to a schematic cross-sectional view of the substrate and to a schematic top view of the substrate, respectively. FIG. 6B illustrates a top view of the substrate when seen from the first surface side, in which the protective film 40 is shown by hatching for the sake of convenience. Although in FIGS. 6A, 6B, 7 and 8, the protective film is illustrated as covering the first surface together with part of the protruding region of the DAF (see FIG. 5B), the arrangement of the protective film is not limited thereto.

A first laser beam L1 is irradiated along a first path P1 starting at a point in the protruding region 30a of the DAF 30, passing over across the substrate 10 in the dicing region, and ending at another point in the protruding region 30a of the DAF 30. A second laser beam L2 is irradiated along a second path P2 starting at a point on the edge on one side of the substrate 10, passing over the dicing region, and ending at another point on the edge on the other side of the substrate 10. The irradiation locus on the dicing region along the second path P2 in the second irradiation step agrees with the irradiation locus on the dicing region along the first path P1 in the first irradiation step.

(Second Way)

The second way is to irradiate a laser beam (third laser beam) successively to the protruding region of the DAF and the substrate, with the power density of the third laser beam changed between when irradiated to the substrate and when irradiated to the protruding region of the DAF. Specifically, in the third laser beam scanned along the first path, the power density of the third laser beam irradiated to the protruding region of the DAF is set smaller than that irradiated to the substrate in the dicing region. Thus, the protective film (further, the wiring layer) on the substrate can be reliably removed, while the damage to the holding sheet by laser beam irradiation can be suppressed. The power density means a light intensity per unit area, which is expressed by the unit, for example, $W/cm^2$.

The power density of the third laser beam irradiated to the protruding region can be reduced by, for example, lowering the output power of the third laser beam irradiated to the protruding region. The power density may be reduced by, for example, with the output power of the third laser beam set constant, irradiating the third laser beam with its focal point adjusted to the surface of the protective film in the dicing region or to the surface of a target layer subjected to removal (e.g., wiring layer) of the substrate in the dicing region. The distance from the irradiation head of the laser beam to the surface of the protruding region of the DAF is usually longer than the distance to the surface of the target layer of the substrate. For example, when removing the protective film and the wiring layer of the substrate, the distance from the irradiation head of the laser beam to the surface of the protruding region of the DAF is longer by the thickness of the whole substrate, than the distance to the surface of the target layer of the substrate. Therefore, when irradiated with a constant output power, the third laser beam becomes defocused on the surface of the protruding region, on which the power density of the third laser beam becomes small. In this way, at least part of the protruding region of the DAF can be removed, with less damage to the holding sheet. The focal point of the third laser beam is adjusted to the surface of the target layer (e.g., wiring layer) on the first surface side.

The third laser beam is irradiated, for example, under the conditions that ablate at least the protective film. In this case also, the third laser beam is irradiated in a defocused state to the protruding region, causing less damage to the holding sheet. Irradiation of the third laser beam along the first path is performed one or more times ($N_3 \geq 1$), and may be performed two or more times ($N_3 \geq 2$). When $N_3 \geq 2$, the irradiations of the third laser beam may be performed under the same conditions or different conditions.

Figure 7:
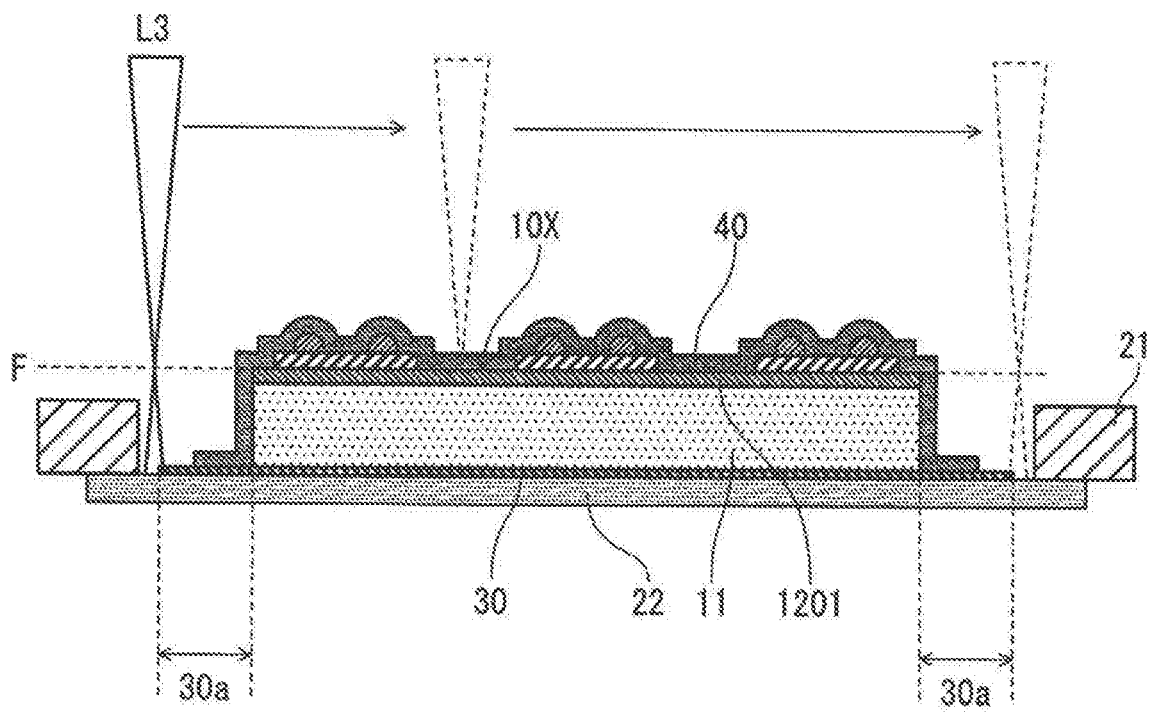
FIG. 7 is a diagram for explaining a second way in the laser grooving step according to the embodiment of the present invention, with reference to a schematic cross-sectional view of the substrate.

FIG. 7 is a diagram for explaining the second way in the laser grooving step according to the present embodiment, with reference to a schematic cross-sectional view of the substrate.

The focal point of a third laser beam L3 is adjusted to the surface of the wiring layer (multilevel wiring layer 1201) of the substrate in the dicing region on the first surface 10X side. In other words, a focal plane F of the third laser beam L3 is the surface of the multilevel wiring layer 1201 on the first surface 10X side. Therefore, on the surface of the protruding region 30a, the third laser beam is defocused, and the power density of the third laser beam L3 irradiated to the protruding region 30a is smaller than that irradiated to the multilevel wiring layer 1201 in the dicing region. Thus, the multilevel wiring layer 1201 in the dicing region and at least part of the protruding region 30a are removed, while the damage to the holding sheet 22 can be suppressed.

(Other Ways)

Other than the above, the damage to the holding sheet can be suppressed by, for example, increasing the speed of the irradiation head moving over the protruding region, or by reducing the oscillation frequency of the laser beam irradiated to the protruding region.

Figure 8:
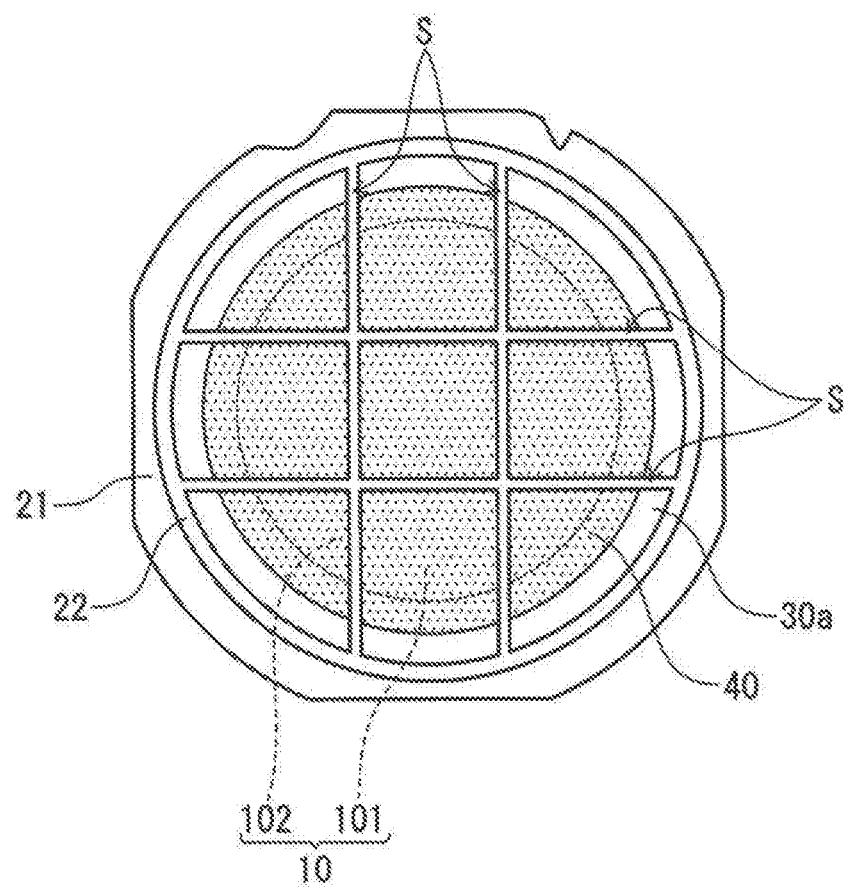
FIG. 8 is a schematic top view of the substrate after the laser grooving step according to the embodiment of the present invention.

FIG. 8 is a schematic top view of the substrate after the laser grooving step according to the present embodiment. The protective film 40 and the wiring layer (multilevel wiring layer 1201) in the dicing region 102 are removed, forming an opening S.

The laser beam used for laser scribing may have any frequency; the frequency is, for example, 1 kHz or more and 200 kHz or less. A higher frequency makes high-speed processing possible. The laser beam may be of any laser oscillation mechanism. Examples of the laser include: a semiconductor laser using a semiconductor as a medium for laser oscillation; a gas laser using a gas, such as carbon dioxide ($CO_2$), as the medium; a solid laser using YAG; and a fiber laser. Any laser oscillator may be used for laser generation. For example, a pulse laser oscillator for emitting a pulse laser beam may be used because of its low thermal impact on the substrate. The laser beam may have any pulse width. In view of reducing the thermal impact, the pulse width is preferably 500 nanoseconds or less, more preferably 200 nanoseconds or less.

The intensity distribution profile of each laser beam is not limited. The profile in the width direction may have a Gaussian distribution, and may have a top-hat distribution. The Gaussian distribution is a normal distribution. In the top-hat distribution, the intensity is almost constant over the entire width of the dicing region, and the intensity around the ends (the shoulder of the curve at which the intensity drops sharply) shows no much difference from the intensity at the center, and is, for example, 90% or more and 98% or less of the intensity at the center.

(5) First Etching Step

This step exposes the substrate to a first plasma, to etch the substrate exposed from the opening. As a result, a plurality of element chips are formed from the substrate, and the DAF is exposed from the opening.

Figure 9:
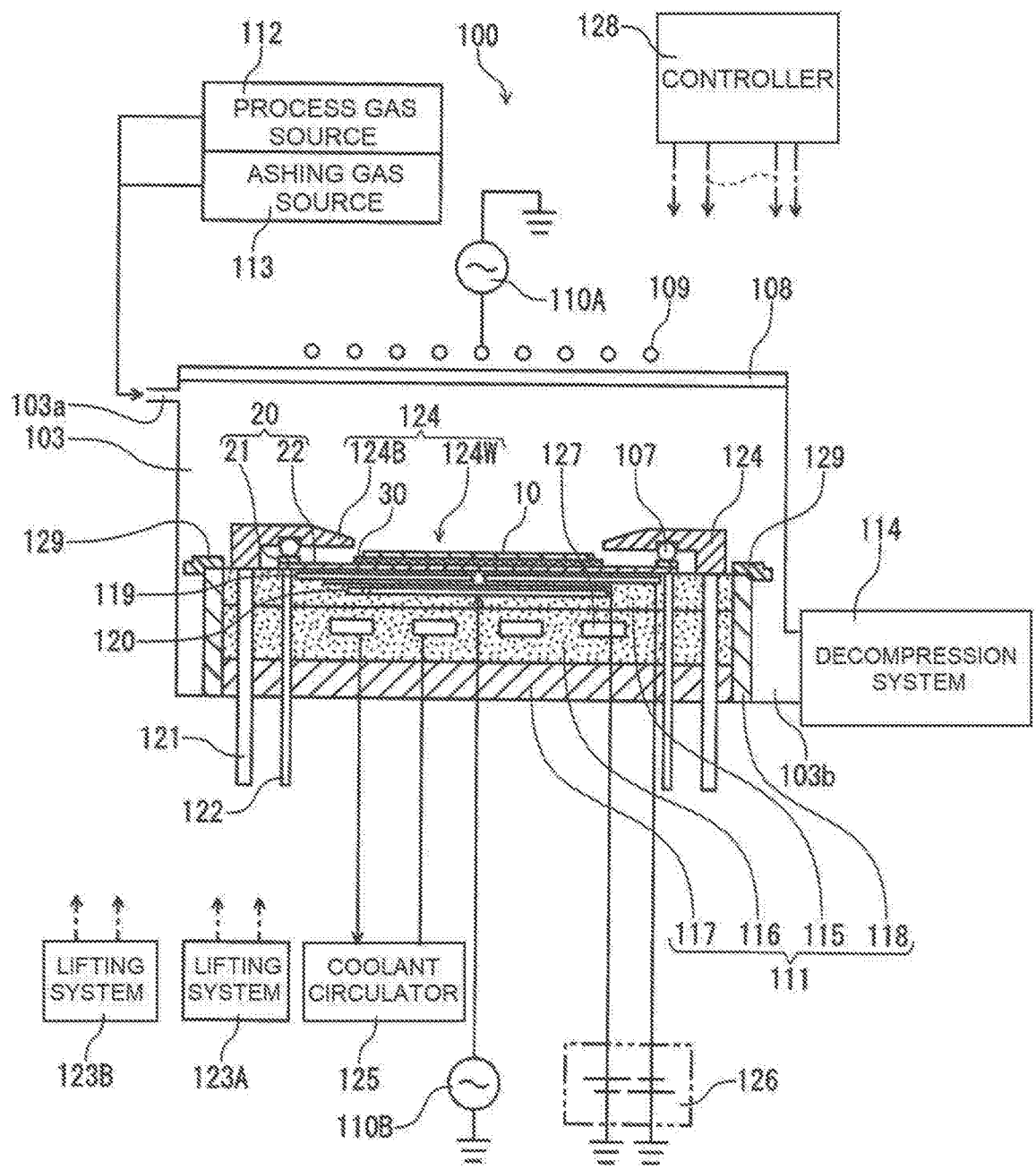
FIG. 9 is a schematic sectional diagram of a plasma processing apparatus.

First, with reference to FIG. 9, a plasma processing apparatus 100 used for plasma etching in the first and second etching steps will be specifically described. The plasma processing apparatus is not limited thereto. FIG. 9 is a schematic sectional diagram of the plasma processing apparatus, in which the protective film 40 is omitted for the sake of convenience.

(Plasma Processing Apparatus)

The plasma processing apparatus 100 includes a stage 111. A conveying carrier 20 is set on the stage 111, with the surface holding a substrate 10 of a holding sheet 22 faced upward. The stage 111 has such a size that the whole conveying carrier 20 can be seated thereon. Above the stage 111, a cover 124 having a main body 124B and a window 124W for exposing at least part of the substrate 10 therefrom is arranged. The cover 124 is provided with holding members 107 for holding the frame 21 downward while the frame 21 is on the stage 111. The holding members 107 are preferably a member that can achieve point contact with the frame 21 (e.g., a coil spring or an elastic resin). This can correct a distortion of the frame 21, while restricting a thermal communication between the frame 21 and the cover 124.

The stage 111 and the cover 124 are arranged in a vacuum chamber 103. The vacuum chamber 103 is approximately cylindrical with the top open. The open top is closed by a dielectric member 108 serving as a lid. Examples of the constituent material of the vacuum chamber 103 include aluminum, stainless steel (SUS), and aluminum with anodic oxide coating. Examples of the constituent material of the dielectric member 108 include yttrium oxide ($Y_2O_3$), aluminum nitride (AlN), alumina ($Al_2O_3$), quartz ($SiO_2$), and other dielectric materials. Above the dielectric member 108, a first electrode 109 serving as an upper electrode is arranged. The first electrode 109 is electrically connected to a first high-frequency power source 110A. The stage 111 is positioned on the bottom side in the vacuum chamber 103.

The vacuum chamber 103 is provided with a gas inlet 103a and a gas outlet 103b. The gas inlet 103a is connected to plasma-generating gas (process gas) supply sources, i.e., a process gas source 112 and an ashing gas source 113, each through a conduit. The gas outlet 103b is connected to a decompression system 114 including a vacuum pump for exhausting the gas within the vacuum chamber 103 to reduce the pressure therein. While supplying a process gas into the vacuum chamber 103, the first electrode 109 is supplied with a high-frequency power from the first high-frequency power source 110A. A plasma is thus generated in the vacuum chamber 103.

The stage 111 includes an electrode layer 115, a metal layer 116, and a base table 117 supporting the electrode layer 115 and the metal layer 116, each being approximately circular. The stage 111 further includes a peripheral member 118 surrounding the electrode layer 115, the metal layer 116, and the base table 117. The peripheral member 118 is formed of a metal having electrical conductivity and etching resistance, and serves to protect the electrode layer 115, the metal layer 116, and the base table 117 from plasma exposure. On the top surface of the peripheral member 118, an annular circumferential ring 129 is provided. The circumferential ring 129 serves to protect the top surface of the peripheral member 118 from plasma exposure. The electrode layer 115 and the circumferential ring 129 are formed of, for example, the dielectric material as listed above.

Within the electrode layer 115, an electrode for electrostatic chucking (hereinafter, ESC electrode 119), and a second electrode 120 electrically connected to a second high-frequency power source 110B are disposed. The ESC electrode 119 is electrically connected to a DC power source 126. The ESC electrode 119 and the DC power source 126 constitute an electrostatic chuck system. The electrostatic chuck system pulls the holding sheet 22 onto the stage 111 and secures it thereto. Although a description will be made below of a case where the electrostatic chuck system is used as a securing system for securing the holding sheet 22 to the stage 111, this should not be taken as a limitation. A clamp (not shown) may be used for securing the holding sheet 22 to the stage 111.

The metal layer 116 is formed of, for example, aluminum with an anodic oxidation coating. The metal layer 116 contains a coolant channel 127 configured to cool the stage 111. By cooling the stage 111, the holding sheet 22 set on the stage 111 is cooled down, and the cover 124 partially in contact with the stage 111 is also cooled down. This protects the substrate 10 and the holding sheet 22 from being damaged by being heated during plasma processing. A coolant in the coolant channel 127 is circulated by a coolant circulator 125.

Around the peripheral portion of the stage 111, a plurality of support members 122 extending through the stage 111 are provided. The support members 122 support the frame 21 of the conveying carrier 20. The support members 122 are driven by a first lifting system 123A, and move upward and downward. The conveying carrier 20 having delivered into the vacuum chamber 103 is passed onto the support members 122 at a predetermined raised position. Then the support members 122 descend until their top surfaces become flush with or lower than the top surface of the stage 111, which sets the conveying carrier 20 at a predetermined position on the stage 111.

A plurality of lifting rods 121 are coupled to the peripheral edge of the cover 124, to lift and lower the cover 124. The lifting rods 121 are driven by a second lifting system 123B. The lifting and lowering operation of the cover 124 by the second lifting systems 123B can be controlled independently from the operation by the first lifting system 123A.

Figure 10:
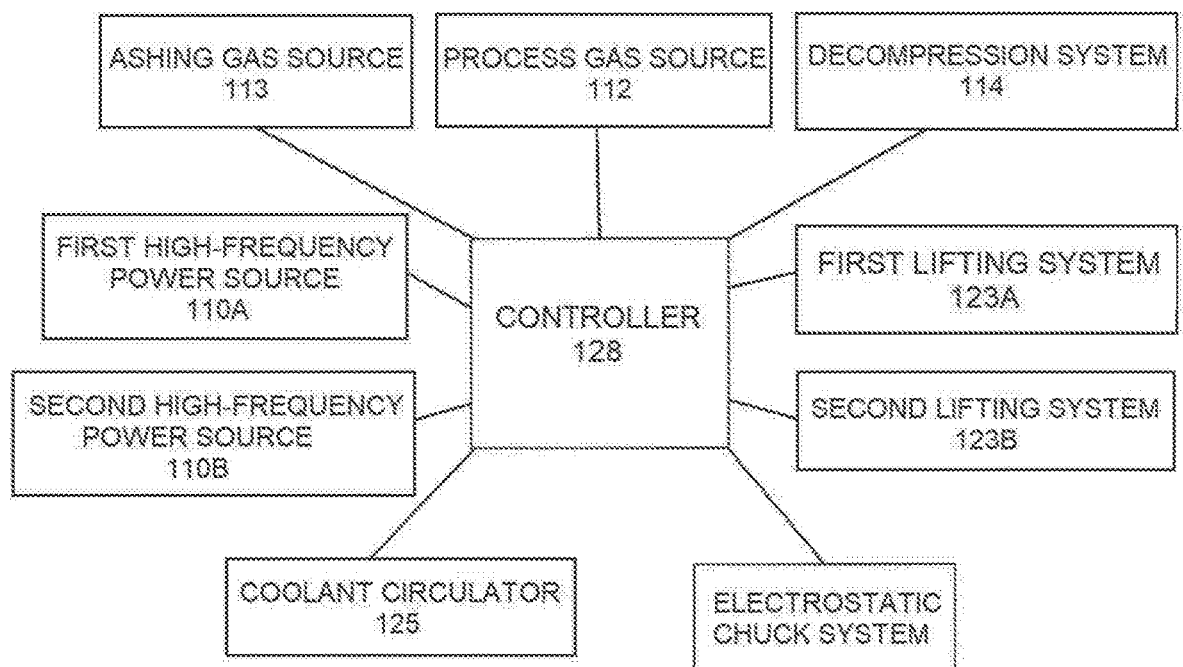
FIG. 10 is a block diagram of the plasma processing apparatus used in one embodiment of the present invention.

A controller 128 is configured to control operations of component elements of the plasma processing unit 100 including the first high-frequency power source 110A, the second high-frequency power source 110B, the process gas source 112, the ashing gas source 113, the decompression system 114, the coolant circulator 125, the first and second lifting systems 123A and 123B, and the electrostatic chuck system. FIG. 10 is a block diagram of the plasma processing apparatus used in the present embodiment.

After the conveying carrier 20 holding the substrate 10 and the DAF 30 is delivered into the vacuum chamber 103, the substrate 10 is subjected to etching while being seated on the stage 111.

When delivering the substrate 10, within the vacuum chamber 103, the cover 124 is lifted to a predetermined position by means of the lifting rods 121. A gate valve (not shown) opens to allow the conveying carrier 20 to be delivered into the vacuum chamber 103. The support members 122 are on standby at a raised position. When the conveying carrier 20 reaches a predetermined position above the stage 111, the conveying carrier 20 is passed onto the support members 122. The conveying carrier 20 is placed onto the support members 122, with the adhesive side 22X of the holding sheet 22 faced upward.

After the conveying carrier 20 is passed onto the support members 122, the vacuum chamber 103 is closed in a hermetically sealed state. Next, the support members 122 start descending. When the support members 122 have descended until their top surfaces become flush with or lower than the top surface of the stage 111, the conveying carrier 20 is set on the stage 111. Then the lifting rods 121 are driven to lower the cover 124 to a predetermined position. The distance between the cover 124 and the stage 111 is adjusted such that the holding members 107 in the cover 124 each come in point-contact with the frame 21. In this way, the frame 21 is pressed downward by the holding members 107, and covered with the cover 124, with at least part of the substrate 10 exposed from the window 124W.

The main body 124B of the cover 124 is, for example, doughnut-shaped having an approximately circular outline, and has a consistent width and thin thickness. The inner diameter of the main body 124B (diameter of the window 124W) is smaller than the inner diameter of the frame 21, and the outer diameter of the main body 124B is greater than the outer diameter of the frame 21. Therefore, when the cover 124 is lowered, the main body 124B can cover the frame 21. From the window 124W, at least part of the substrate 10 is exposed. On the other hand, the DAF 30 is barely exposed. Therefore, in each etching step, the protruding region 30a of the DAF 30 is unlikely to have a scar or cut that may be a cause of breaking.

The main body 124B of the cover 124 is formed of, for example, a dielectric such as ceramics (e.g., alumina, aluminum nitride) or quarts, or a metal such as aluminum or aluminum with an anodic oxidation coating. The holding members 107 can be formed of the aforementioned dielectric or metal, or a resin material.

After the conveying carrier 20 is passed onto the support members 122, a voltage is applied to the ESC electrode 119 from the DC power source 126. By doing this, the holding sheet 22 is brought into contact with the stage 111 and concurrently, is electrostatically chucked on the stage 111. The voltage application to the ESC electrode 119 may be initiated after the holding sheet 22 is set on (or comes in contact with) the stage 111.

Upon completion of etching, the gas in the vacuum chamber 103 is evacuated, and the gate valve opens. The conveying carrier 20 holding a plurality of element chips is delivered out of the plasma processing unit 100 by means of a conveying system having entered through the gate valve.

After the conveying carrier 20 is delivered out, the gate valve is immediately closed. The conveying carrier 20 may be delivered out by performing the above-mentioned procedures of setting the conveying carrier 20 on the stage 11 in the reverse order. Specifically, after the cover 124 is lifted to a predetermined position, the voltage applied to the ESC electrode 119 is cut off, to release the chucking of the conveying carrier 20 to the stage 111. Then, the support members 122 are raised. After the support members 122 reach a predetermined raised position, the conveying carrier 20 is delivered out of the vacuum chamber 103.

In the first etching step, the substrate is exposed to the first plasma, to etch the dicing region exposed from the opening, so that the DAF is exposed. The conditions for generating the first plasma may be set according to the material of the semiconductor layer to be etched and other factors.

When the semiconductor layer contains Si, the semiconductor layer is plasma-etched by, for example, a Bosch process. The Bosch process repeats a film deposition step, a deposited-film etching step, and a Si etching step in this order, thereby to dig the semiconductor layer in the depth direction.

The film deposition step is carried out, for example, under the following conditions: while supplying $C_4F_8$ as a process gas at a rate of 150 sccm or more and 250 sccm or less, the pressure in the vacuum chamber is controlled to 15 Pa or more and 25 Pa or less, with the input power to the first electrode from the first high-frequency source set at 1500 W or more and 2500 W or less, and the input power to the second electrode from the second high-frequency power source set at 0 W or more and 50 W or less; the processing time is 2 sec or more and 15 sec or less.

The deposited-film etching step is carried out, for example, under the following conditions: while supplying $SF_6$ as a process gas at a rate of 200 sccm or more and 400 sccm or less, the pressure in the vacuum chamber is controlled to 5 Pa or more and 15 Pa or less, with the input power to the first electrode from the first high-frequency power source set at 1500 W or more and 2500 W or less, and the input power to the second electrode from the second high-frequency power source set at 300 W or more and 1000 W or less; the processing time is 2 sec or more and 10 sec or less.

The Si etching step is carried out, for example, under the following conditions: while supplying $SF_6$ as a process gas at a rate of 200 sccm or more and 400 sccm or less, the pressure in the vacuum chamber is controlled to 5 Pa or more and 15 Pa or less, with the input power to the first electrode from the first high-frequency power source set at 1500 W or more and 2500 W or less, the input power to the second electrode from the second high-frequency power source set at 50 W or more and 500 W or less; the processing time is 10 sec or more and 20 sec or less.

By repeating the film deposition step, the deposited-film etching step, and the Si etching step under the conditions as above, the semiconductor layer containing Si can be etched vertically in the depth direction at a rate of 10 μm/min or more and 20 μm/min or less.

Figure 11:
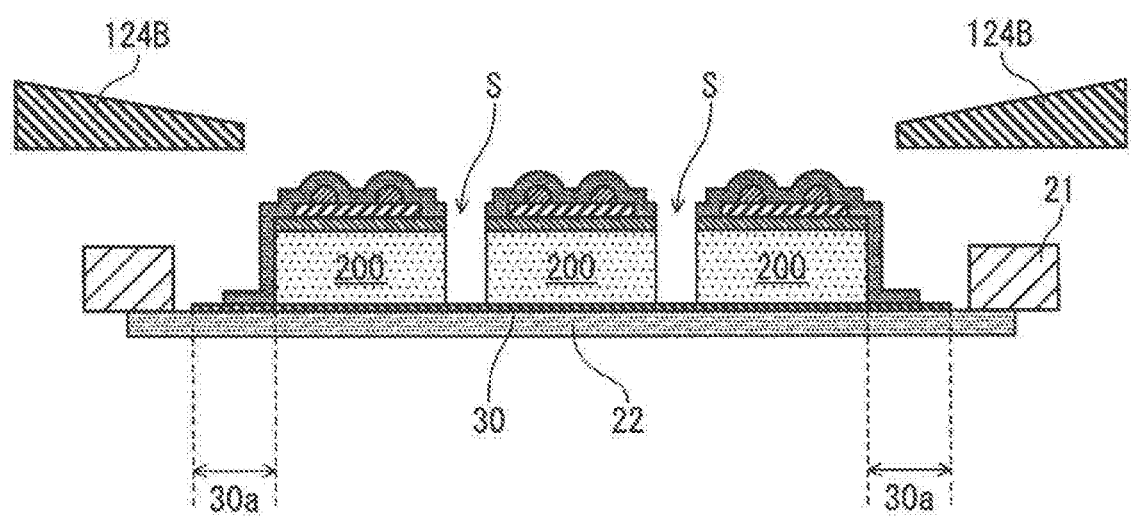
FIG. 11 is a schematic cross-sectional view of element chips produced in a first etching step according to the embodiment of the present invention.

FIG. 11 is a schematic cross-sectional view of element chips produced in the first etching step according to the present embodiment. The substrate is etched along the dicing region, so that a plurality of element chips 200 are formed from the substrate, and the DAF 30 is exposed from the opening S.

(6) Second Etching Step

This step exposes the substrate to a second plasma to etch the DAF exposed from the opening, so that the die attach film is split so as to correspond to the element chips. The second etching step provides a plurality of element chips which are held on the holding sheet via the DAF split for each element chip.

The conditions for generating the second plasma may be set according to the material of the DAF to be etched and other factors. When the DAF is formed of a resin composition containing a resin and an inorganic filler, it is preferable to use a process gas containing oxygen and fluorine to generate the second plasma. Oxygen radicals generated from an oxygen-containing gas are highly reactive with organic materials, such as resin. Fluorine radicals generated from a fluorine-containing gas are highly reactive with inorganic fillers. Therefore, by using a process gas containing oxygen and fluorine, the DAF including an inorganic filler can be efficiently etched, with less scattering of the inorganic filler. Examples of the process gas containing oxygen and fluorine include a mixed gas of oxygen gas ($O_2$) and fluorine-containing gas ($SF_6$, $CF_4$). The ratio of the flow rate of the fluorine-containing gas in the mixed gas is, for example, 5% or more.

With regard to other conditions for generating the second plasma, it is preferable to set the pressure in the vacuum chamber to 5 Pa or more and 10 Pa or less. It is also preferable to supply a high-frequency power of 500 W or more and 1000 W less to the second electrode, so that the stage is supplied with a high bias voltage. Note that raising the bias voltage tends to increase the temperature of the DAF on the stage. To prevent this, it is preferable to cool the stage, for example, to 15° C. or less, to keep the temperature of the DAF at 50° C. or less during the second etching step.

Specifically, the second etching step can be carried out under the following conditions: while supplying a mixed gas of oxygen gas (flow rate: 350 sccm) and $SF_6$ (flow rate: 50 sccm) as a process gas into the vacuum chamber, the pressure in the vacuum chamber is controlled to 5 Pa or more and 10 Pa or less. With a high-frequency power of 3000 W or more and 5000 W less supplied to the first electrode, a high-frequency power of 500 W or more and 1000 W or less is applied to the stage. This etches the DAF at an etching rate of about 1.5 μm/min or more and about 4 μm/min or less.

Figure 12:
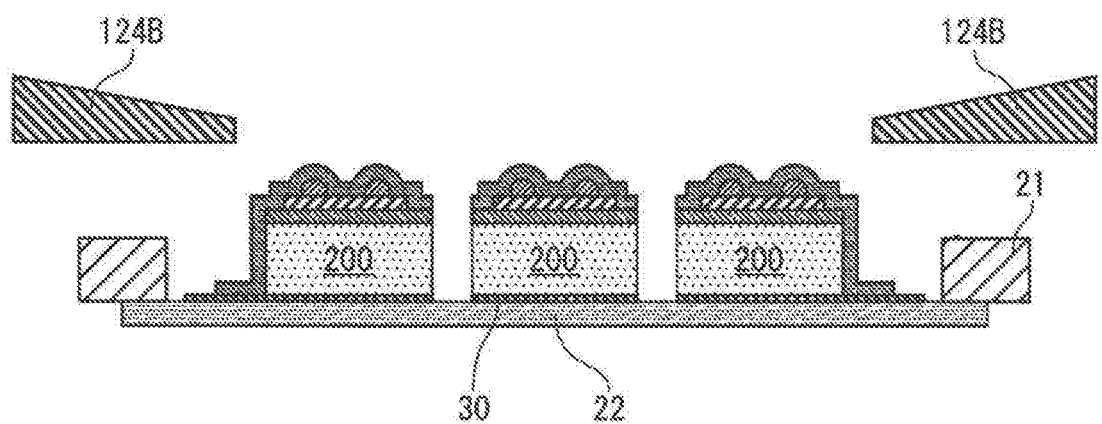
FIG. 12 is a schematic cross-sectional view of the element chips after a second etching step according to the embodiment of the present invention.

FIG. 12 is a schematic cross-sectional view of the element chips after the second etching step according to the present embodiment. The DAF 30 is split so as to correspond to the element chips 200.

Figure 13:
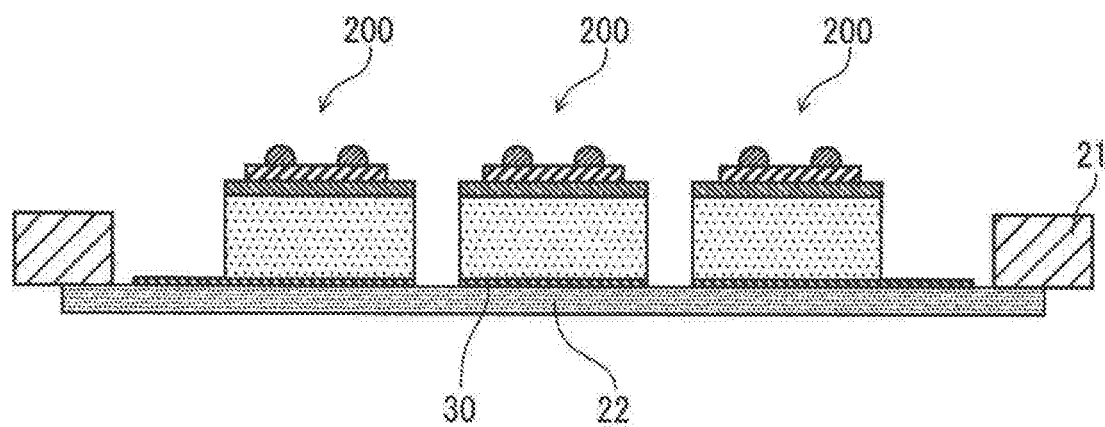
FIG. 13 is a schematic cross-sectional view of the element chips from which a protective film has been removed.

After the DAF is etched, ashing may be performed before the conveying carrier is delivered out. The ashig removes the protective film covering the surface of the substrate. FIG. 13 is a schematic cross-sectional view of the element chips from which the protective film has been removed.

The ashing can be carried out under the following conditions: while supplying a mixed gas of $CF_4$ and $O_2$ as an ashing gas (flow rate of $CF_4$:$O_2$=1:10) at a flow rate of 150 sccm or more and 300 sccm or less, the pressure in the vacuum chamber is controlled to 5 Pa or more and 15 Pa or less, with the input power to the first electrode from the first high-frequency source set at 1500 W or more and 5000 W or less, and the input power to the second electrode from the second high-frequency power source set at 0 W or more and 300 W or less. The input power to the second electrode in the ashing step is preferably set smaller than that in the first etching step.

It is to be noted that when the protective film is soluble in water, the protective film may be removed by washing with water, instead of ashing.

(7) Pickup Step

This step detaches the element chips, together with the split DAF, from the holding sheet.

In the pickup step, for example, the holding sheet is expanded to widen the gap between the element chips, and then, the holding sheet is thrusted upward together with the DAF with thrust-up pins from the non-adhesive side of the holding sheet. This allows at least part of the element chip to separate from the holding sheet. The element chips are then detached from the holding sheet.

The holding sheet is expanded by, for example, pressing a jig against the non-adhesive side of the holding sheet, and in this state, moving the jig upward (toward the adhesive side); or moving the conveying carrier toward the non-adhesive side. At this time, in the protruding region, the DAF is split along the cut formed in the laser grooving step. Therefore, the protruding region is unlikely to float away from the holding sheet.

Figure 14:
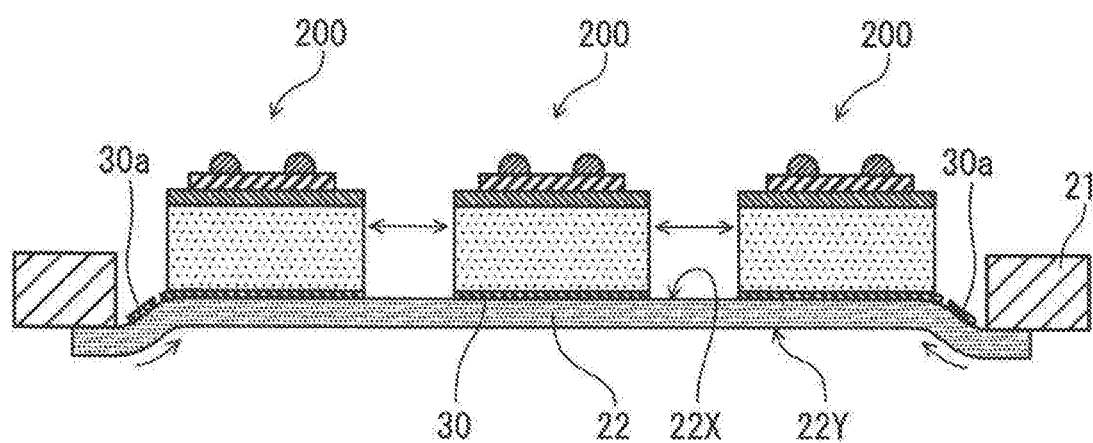
FIG. 14 is a schematic cross-sectional view of the element chips in a pickup step according to the embodiment of the present invention.

FIG. 14 is a schematic cross-sectional view of the element chips in the pickup step according to the present embodiment. The holding sheet 22 is expanded, and the DAF 30 is split in the protruding region 30*a*, along the cut formed in the laser grooving step.

The manufacturing method of the present invention is useful as a method of manufacturing element chips by plasma etching, from a substrate mounted on the die attach film.

REFERENCE NUMERALS

- 10: substrate
  - 10X: first surface
  - 10Y: second surface
    - 11: semiconductor layer
    - 12: wiring layer
      - 1201: multilevel wiring layer
      - 1202: insulating film
      - 1203: bump
- 20: conveying carrier
  - 21: frame
    - 21*a*: notch
    - 21*b*: corner cut
  - 22: holding sheet
    - 22X: adhesive side
    - 22Y: non-adhesive side
- 30: die attach film (DAF)
  - 30*a*: protruding region
- 40: protective film
- 100: plasma processing apparatus
  - 103: vacuum chamber
    - 103*a*: gas inlet
    - 103*b*: gas outlet
  - 108: dielectric member
  - 109: first electrode
  - 110A: first high-frequency power source
  - 110B: second high-frequency power source
  - 111: stage
  - 112: process gas source
  - 113: ashing gas source
  - 114: decompression system
  - 115: electrode layer
  - 116: metal layer
  - 117: base table
  - 118: peripheral member
  - 119: ESC electrode
  - 120: second electrode
  - 121: lifting rod
  - 122: support member
  - 123A, 123B: lifting system
  - 124: cover
    - 124B: main body
    - 124W: window
  - 125: coolant circulator
  - 126: DC power source
  - 127: coolant channel
  - 128: controller
  - 129: circumferential ring
- 200: element chip

What is claimed is:

1. An element chip manufacturing method comprising:
   a preparation step of preparing a substrate including a plurality of element regions and a dicing region defining the element regions, the substrate having a first surface and a second surface opposite the first surface;
   an attaching step of attaching the substrate via a die attach film to a holding sheet secured on a frame, with the die attach film facing the second surface, the die attach film being larger than the substrate, and the die attach film having a protruding region protruding from the substrate so as to surround an edge of the substrate;
   a protective film formation step of forming a protective film that covers the first surface of the substrate attached to the holding sheet;
   a laser grooving step of irradiating a laser beam to the protective film along the dicing region, to form an opening in the protective film, so that the substrate in the dicing region is exposed from the opening;
   a first etching step of exposing the substrate to a first plasma to etch the substrate exposed from the opening, so that a plurality of element chips are formed from the substrate and so that the die attach film is exposed from the opening;
   a second etching step of exposing the substrate to a second plasma to etch the die attach film exposed from the opening, so that the die attach film is split so as to correspond to the element chips; and
   a pickup step of detaching the element chips from the holding sheet, together with the split die attach film; wherein
   the laser grooving step includes a first irradiation step of irradiating the laser beam to the protective film along the dicing region and the protruding region of the die attach film, the laser beam being irradiated under conditions that remove the protective film in the dicing region and at least part of the die attach film in the protruding region, but do not remove the holding sheet corresponding to the protruding region.

2. The element chip manufacturing method of claim 1, wherein in the first irradiation step, the laser beam is irradiated along a first path, the first path starting at a point on the protruding region of the die attach film, passing over across the substrate in the dicing region, and ending at another point on the protruding region of the die attach film.

3. The element chip manufacturing method of claim 2, wherein
   the laser grooving step further includes a second irradiation step of irradiating the laser beam along a second path, the second path starting at a point on the edge of the substrate, passing over the dicing region, and ending at another point on the edge of the substrate, and
   an irradiation locus on the dicing region along the second path agrees with an irradiation locus on the dicing region along the first path.

4. The element chip manufacturing method of claim 2, wherein in the laser beam scanned along the first path, a power density of the laser beam irradiated to the protruding region of the die attach film is smaller than a power density of the laser beam irradiated to the substrate in the dicing region.

5. The element chip manufacturing method of claim 4, wherein
   an output power of the laser beam scanned along the first path is set constant, and
   a focal point of the laser beam scanned along the first path is on the first surface of the substrate in the dicing region, rather than on the protruding region of the die attach film.

6. The element chip manufacturing method of claim 1, wherein in the pickup step, the holding sheet is expanded to widen a gap between the element chips, and then the element chips are detached from the holding sheet.

* * * * *